United States Patent [19]
Sussman et al.

[11] Patent Number: 6,016,058
[45] Date of Patent: Jan. 18, 2000

[54] IN-SERVICE WIRING VERIFICATION CIRCUITRY

[75] Inventors: Robert Bradley Sussman, Middlesex; Carl Joseph Bilicska, Somerset, both of N.J.; Randolph Leonard Kasprzyk, Cook, Ill.

[73] Assignee: Lucent Technologies Inc., Murray Hill, N.J.

[21] Appl. No.: 08/942,526

[22] Filed: Oct. 2, 1997

[51] Int. Cl.[7] .............................. G01R 31/02; H04M 1/24
[52] U.S. Cl. ........................ 324/543; 324/66; 324/523; 379/25
[58] Field of Search ...................................... 324/508, 511, 324/522, 523, 524, 527, 538, 539, 593, 555, 66, 67; 379/1, 24, 25, 26

[56] References Cited

U.S. PATENT DOCUMENTS

| | | | |
|---|---|---|---|
| 4,130,794 | 12/1978 | Cox | 324/538 |
| 4,208,553 | 6/1980 | Kaplan | 324/66 |
| 4,652,813 | 3/1987 | Bakke et al. | 324/66 |
| 5,309,499 | 5/1994 | Webber | 379/29 |
| 5,488,307 | 1/1996 | Plott | 324/66 |
| 5,625,667 | 4/1997 | Vogt, III et al. | 379/24 |
| 5,764,725 | 6/1998 | Martin, Jr. et al. | 379/25 |

*Primary Examiner*—Dep N. Do

[57] ABSTRACT

In-service verification/continuity testing apparatus and method for testing the continuity integrity of wiring installed to an in-use operational circuit. The apparatus measures the voltage difference created by injecting two equal but opposite insignificant currents through a test path. A current loop is created by placing an isolated ground, which is referenced to unique detection circuitry provided in the testing apparatus. An accurate voltage differential calculation is accomplished by using a sample and hold circuit in parallel with switching the injected currents. Biasing the detection circuitry using two identical but inverse voltages with a reference to the isolated ground allows the detection circuit to subtract out extraneous currents flowing through the wiring path due to external voltage and current sources.

16 Claims, 7 Drawing Sheets

| R3 | 8 | 16 | 24 | 32 | 40 | 48 | 56 | 64 | 72 | 80 | 88 | 96 | 104 | 112 | 120 | 128 | 8 |
| T3 | 7 | 15 | 23 | 31 | 39 | 47 | 55 | 63 | 71 | 79 | 87 | 95 | 103 | 111 | 119 | 127 | 7 |
| R2 | 6 | 14 | 22 | 30 | 38 | 46 | 54 | 62 | 70 | 78 | 86 | 94 | 102 | 110 | 118 | 126 | 6 |
| T2 | 5 | 13 | 21 | 29 | 37 | 45 | 53 | 61 | 69 | 77 | 85 | 93 | 101 | 109 | 117 | 125 | 5 |
| R1 | 4 | 12 | 20 | 28 | 36 | 44 | 52 | 60 | 68 | 76 | 84 | 92 | 100 | 108 | 116 | 124 | 4 |
| T1 | 3 | 11 | 19 | 27 | 35 | 43 | 51 | 59 | 67 | 75 | 83 | 91 | 99 | 107 | 115 | 123 | 3 |
| R0 | 2 | 10 | 18 | 26 | 34 | 42 | 50 | 58 | 66 | 74 | 82 | 90 | 98 | 106 | 114 | 122 | 2 |
| T0 | 1 | 9 | 17 | 25 | 33 | 41 | 49 | 57 | 65 | 73 | 81 | 89 | 97 | 105 | 113 | 121 | 1 |

SEQUENCE: POSITION UNDER TEST (ADJACENT POSITIONS CHECKED FOR SHORTS)
1(2,9,10), 2(3,9,10,11), 3(4,10,11,12), . . . ., 127(128), 128( ); END TEST

FIG. 11

```
int AdjacentPinsOdd[MAX_ADJPATTERNS][NUM_ADJPINS]=
        {
        {1,7,8,9},         //Blocks with base 8 Probing
        {1,15,16,17},      //Blocks with base 16 Probing
        {1,2,31,33},       //Cosmic Blocks Odd Numbered Pins
        };
int AdjacentPinsEven[MAX_ADJPATTERNS][NUM_ADJPINS]=
        {
        {1,7,8,9},         //Blocks with base 8 Probing
        {1,15,16,17},      //Blocks with base 16 Probing
        {1,2,3,-29},       //Cosmic Blocks Even Numbered Pins
        };

void SetUpAdjPos()
{
if (ShortTest=0) return;   //Disable Adjacent Pins Short Test
TmpSinglePosition = Map Position from Remote Single Probe sequence
            using position under test if (TmpSinglePosition >= MaxConnections) return;

for (k=0; k<NUM_ADJPINS; k++)
        {
        if (An Odd Position)
                AdjacentInc = AdjacentPinsOdd[ShortTest][k];
        else //if an Even Position
                AdjacentInc = AdjacentPinsEven[ShortTest][k];
        //Check for out of range Position Numbers
        if ((TmpSinglePosition+AdjacentInc) is not a valid connection)) continue;

TmpMapPosition = Map Position from Remote Single Probe sequence
            using (TmpSinglePosition+AdjacentInc)

// Check if in range before adding to ajacent list
        if (TmpMapPosition is a valid connection)
                Add TmpMapPosition to Connection Checklist;
        }

}
```

IN-SERVICE WIRING VERIFICATION CIRCUITRY

FIELD OF THE INVENTION

The present invention relates generally to electric circuit testers, and more specifically, to a novel apparatus for testing wiring integrity, continuity, (shorts, opens, reversals, and tip voltages) on installed wiring that is in-service without disrupting service.

BACKGROUND OF THE INVENTION

The advancement of technology, in any industry, requires the replacement of older equipment with newer, faster, and more efficient equipment. In the telephone industry, for example, older telephone switches that function to complete the circuit between a customer's telephone (talk circuit) and the telephone company's central office, are continually being replaced by more inexpensive, efficient, and higher capacity switches. For example, FIG. 1(a) illustrates a conventional communications switching circuit, e.g., a customer telephone, connected to the telephone company switch 15 through a Main Distributing Frame ("MDF"). The switch 15 includes a −48 volt source which is connected to the "Ring" connection through a 200 ohm impedance and passed through to the "Ring" connection of the talk circuit through the MDF connector 20. A return path from the talk circuit is provided on the "Tip" connection which is passed through the MDF connector 22 to ground through a second 200 ohm impedance. As shown in FIG. 1(a), there is a voltage of approximately −48 V between the tip and ring during customer equipment "on-hook" conditions, when there are no paths present for the office power to flow through the customer loop. During "off-hook" conditions there is a path provided by the customer loop for a current $I_{LOOP}$ to flow (typically through a telephone, modem, or other telecommunications equipment.) Typical voltages between customer tip and ring during "off-hook" conditions vary from about −7.0 Volts to −48 Volts.

Currently, the older switching units such as, e.g., the 1ESS/1AESS/2BESS (products of Lucent Technologies, assignee of the instant invention) for switching several thousand connections to the MDF of a telephone central office, are being replaced with newer, more functional, high capacity switch 30, e.g., model 5ESS (product of Lucent Technologies) having 10,000 or more connections. As shown in FIG. 1(b), the installation of the new switch 30, into the existing switching circtuit structure of FIG. 1(a) requires the splicing of a connecting lead, e.g., leads 32a and 32b, from the 5ESS switch to the corresponding leads, e.g., 23a and 23b of the older switch 15, e.g., 1AESS switch, utilizing a splicing connector block 25, e.g., a 711 connector. Before removing the connections of the older switch 15, verification must be made to ensure that all of the spliced connections, and hence, all of the possible circuit connections between the MDF and the new switch 30, are complete. This essentially entails an in-service wiring verification technique, and test sets have been built to accomplish this task.

One prior art in-circuit verification test system, the "Minitrace" Single Lead Continuity Tester ITE-6157, manufactured by the C.E.Cox Company, provides in-service wire verification/continuity tests on a single lead at a time, and requires two installers to simultaneously probe a wire from opposite ends while listening for a verification tone to be heard. If no tone was heard, an indication is provided that an open wire exists or that the connected wires were on different leads. No provision was made for testing the possibility of adjacent shorts and if either installer makes an error in placement, continuity will not be detected. This procedure was slow, less accurate (shorts could not readily be found, and opens and reversals were difficult to interpret), and additionally was prone to installer operation error because of fatigue from hours of repetitious work.

U.S. Pat. No. 4,130,794 to Cox describes another early in-circuit tester that provides a voltage source enabling continuity detection in otherwise unpowered circuits. These prior art testers were, at best, semi-automated, and a fully automated in-circuit testing solution is highly desirable.

SUMMARY OF THE INVENTION

The instant invention is an in-circuit wiring verification test set which can provide non-obtrusive, multi-lead, in-service verification/continuity tests. It provides many competitive advantages to installation including speed, accuracy, and isolation of the tested wiring as well as versatility in handling all common installation configurations, adjacent short detection algorithms, audio and visual error indications and prompts, and debugging tools.

In accordance with the principles of the invention, in-service verification/continuity testing is accomplished by measuring the voltage difference created by injecting two equal but opposite insignificant currents through the test path. The current loop is created by placing an isolated ground, which is referenced to unique detection circuitry provided in the apparatus, on the junction between the line under test and the MDF (Main Distributing Frame) on the remote end and connecting the equipment being installed, e.g., a 5ESS, to the apparatus of the invention. As will be described, an accurate voltage differential calculation is accomplished by using a sample and hold circuit in parallel with switching the injected currents. Biasing the detection circuitry using two identical but inverse voltages with a reference to the isolated ground allows the detection circuit to subtract out extraneous currents flowing through the wiring path due to external sources such as an off-hook condition.

Loop isolation is accomplished by using mechanical relays to isolate non-connected circuits, opto-isolators to isolate detection circuitry from other verification test circuitry, a doubly isolated power system to isolate world, digital, and detection power sources, and a two stage detection sequence which allows time for the loop and detection references to normalize.

Multi-lead testing is accomplished by using low power consumption components, cycling power separately to each relay board, and using the intelligence of the main unit to scan patterns which work in tandem with customer installed equipment connector blocks.

The various features of novelty which characterize the invention are pointed out with particularity in the claims annexed to and forming a part of the disclosure. For a better understanding of the invention, its operating advantages, and specific objects attained by its use, reference should be had to the drawings and descriptive matter in which there are illustrated and described preferred embodiments of the invention.

DETAILED DESCRIPTION OF THE INVENTION

Figure 1A:
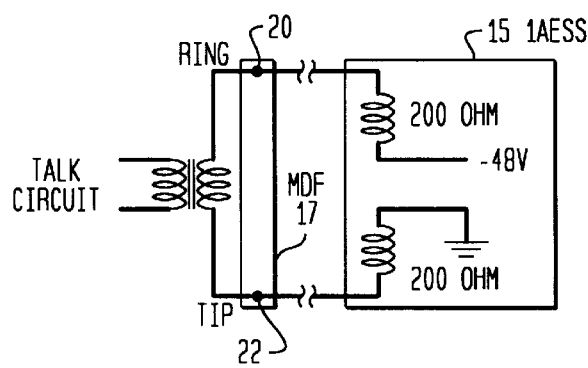
FIG. 1(a) is a prior art diagram of a conventional telephone switching system provided at the telephone company's Central Office.
Figure 1B:
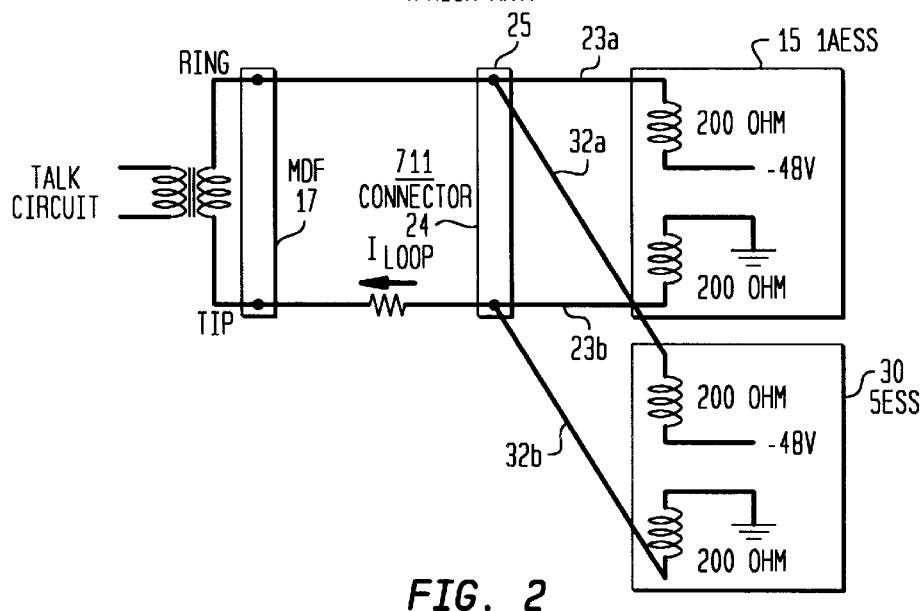
FIG. 1(b) illustrates the incorporation of the newer telephone switch into the existing conventional telephone switching system.
Figure 2:
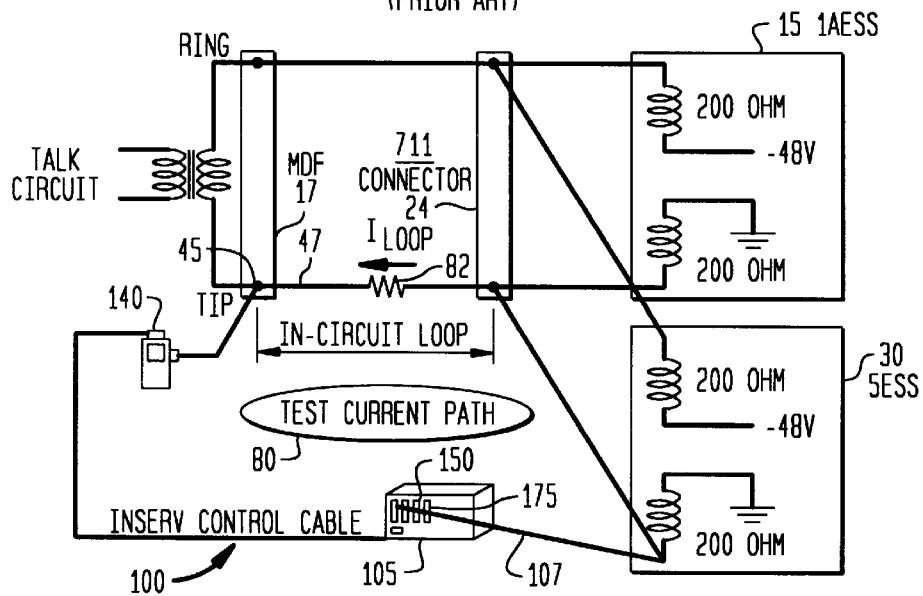
FIG. 2 is a conceptual view of the in-circuit wiring verification/continuity system.

FIG. 2 illustrates the general implementation of the in-circuit test verification system 100 to the circuit of FIG. 1(b) which comprises a main unit 105 housing the system intelligence, a detection circuit 150 for testing continuity, a sample and hold circuit 175, and a remote unit 140 for switching an isolated ground at the MDF/test-path junction 45 and providing means for communicating between the remote and local unit.

Figure 3:
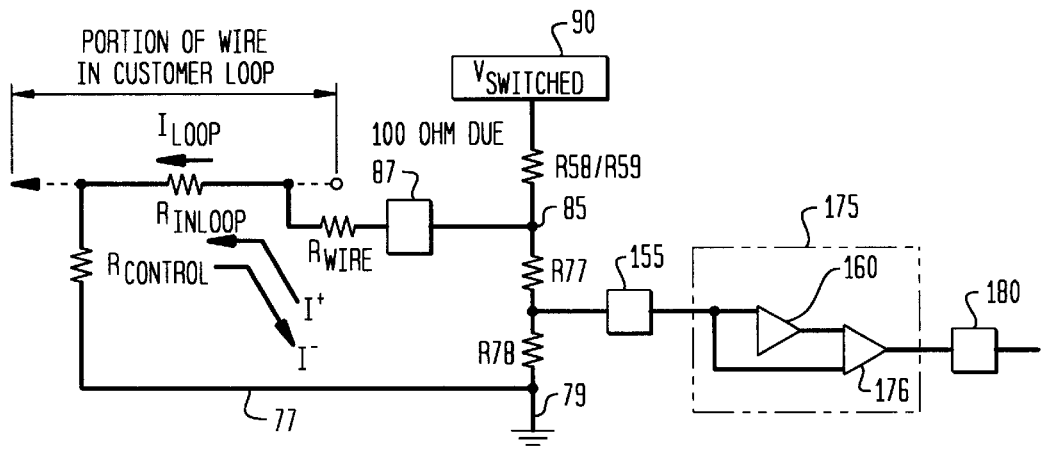
FIG. 3 is a general block diagram of the in-circuit wiring verification/continuity system circuitry.

According to the principles of the invention, in-circuit test verification is performed by injecting a small current, typically less than 0.5 mA, across a lumped impedance 82, hereinafter $R_{TEST}$, representing the total impedance of the test path circuit 80, and then an equal but opposite small current across a lumped impedance 82, and measuring and comparing the voltage differences across the $R_{TEST}$. Specifically, a current loop is created through the test path 80 by the remote unit 140 by switching an isolated ground, which is referenced to the detection circuitry 150 provided in the system, on the junction 45 formed at the line under test, e.g., line 47, and the MDF (Main Distributing Frame) on the remote end and connecting the equipment being installed, e.g., a 5ESS switch, indicated by connection line 107, to the main unit 105 of the system FIG. 3 is a general block diagram showing the implementation of the main functional elements of the detection system. Particularly, a voltage source 90, $V_{SWITCHED}$, applies a voltage through a source resistance R58/R59 to create a voltage at the "Ringin" junction 85 between resistance R58/R59 and resistance R77. In a first instance, as indicated by a first direction arrow I+, $V_{SWITCHED}$ 90 provides a first positive source voltage of approximately +15 V to generate a first small test current flow across $R_{TEST}$ which represents the sum of resistance $R_{Control}$, the resistance of the cable 77 connecting the remote and local units (typically <10 ohm), $R_{InLoop}$, the resistance of the wire in the customer loop, $R_{Wire}$, the resistance of the wire from the 711 connector splice to the local unit, and a 100 ohm protection resistor 87 provided, for example, as lightning protection circuitry. In a second instance, $V_{SWITCHED}$ 90 provides a second negative source voltage of approximately -15 V to generate a second small test current of equal and opposite polarity, as indicated by second directional arrow I-, across $R_{TEST}$. It should be understood that the resultant voltage at the RingIn junction 85 reflects either the resulting voltage divider between R58 and $R_{TEST}$ if $R_{TEST}$ is small or, between R58 and (R77+R78) if $R_{TEST}$ is large. The resulting voltages at the voltage divider junction between R77 and R78 are amplified by amplifier 155 and are sampled and compared to detect presence of continuity. As will be explained, an accurate voltage differential calculation is accomplished by using the sample and hold circuit 175 in parallel with the switching the injected currents. As will be explained, the use of equal and opposite voltages to generate the currents I+ and I- with reference to an isolated ground 79 enables the detection circuit to subtract out extraneous currents flowing through the test path due to external sources such as an off-hook condition.

Particularly, the sample and hold circuit 175 is provided to hold the amplified voltages, $V_{SHIN}$ created by the first and second injected currents and eliminates any voltage alien to the system, e.g., an extraneous voltage caused by an off-hook condition. Such an extraneous voltage, $V_{BAD}$, which may be caused by an off-hook condition is calculated according to equation (1) as follows:

$$V_{BAD}=R_{INLOOP}*I_{LOOP} \tag{1}$$

The sample and hold circuit's output voltage, $V_{SHOUT}$, is input to comparator and isloation circuitry 180 that defines the voltage range which represents a valid connection. The output of the isolator provides an indicator of the presence or absence of continuity.

Figure 4:
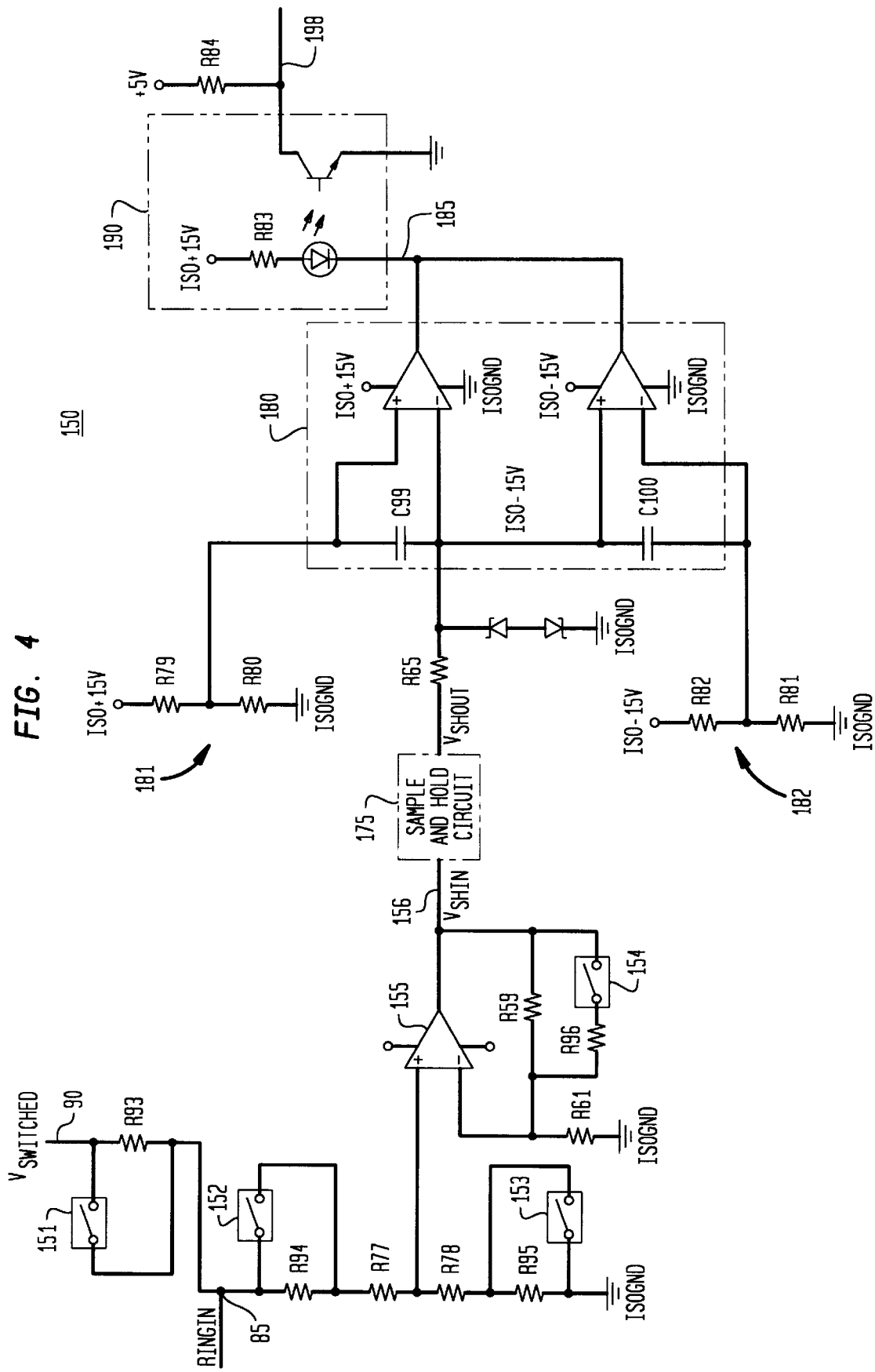
FIG. 4 is a detailed circuit diagram of the detector circuit 150.
Figure 5:
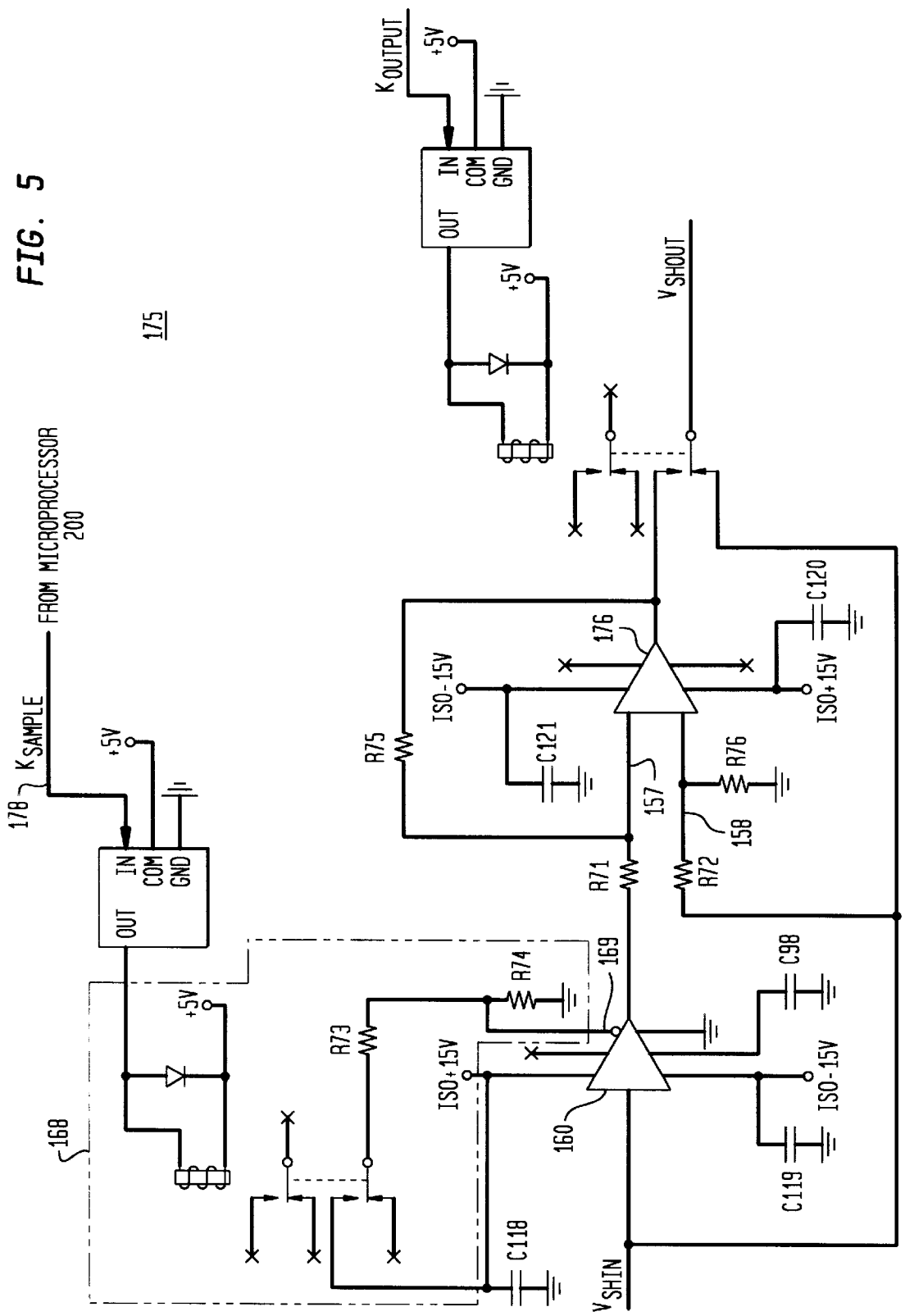
FIG. 5 is a detailed circuit diagram of the sample and hold circuit 175.

The operational details of a preferred embodiment of the in-circuit wiring verification system 100 is illustrated in FIGS. 4 and 5, with FIG. 4 illustrating a preferred embodiment of the detection circuit 150 and the FIG. 5 illustrating a preferred embodiment of the sample and hold circuit 175.

In operation, a multiple throw switch 151, 152 and 153 is closed in order to switch the detection circuit between course detection and fme detection modes of operation. In course detection, switches 151, 152 and 153 are open to provide an impedance of approximately 1 Mohm into the loop which is used to normalize the detection and loop references before switching to Fine Detect mode. In the course detect, the effective $R_{TEST}$ resistance is approximately 72,500 Ohms. Particularly, before the system provides a ring to test for continuity, the voltage present on the RingIn junction 85 is about 12 V, i.e., a product of the voltage divider between R58, R77 and R78 (See FIG. 3). After the connection from the local office, the voltage present on the Ringin junction is -48 V, i.e., the value of the ring. At the instant the connection is made, there is a current flow to correct, normalize, this difference. The value of this current is dependant on the impedance in the path between the isolated power provided by the main unit, i.e., $V_{SWITCHED}$ 90, and the customer loop, the connected ring. During this stage switches 151, 152 and 153 are energized to place damping resistors R93, R94 and R95 into the circuit to dampen the current flow and any "pops" caused by the introduction of this current alien to the customer loop. Additionally, as shown in FIG. 4, a switch 154 is closed during course detection to virtually eliminate gain of amplifier 155. Once the RingIn junction is normalized, the switches 151, 152 and 153 are closed shorting out respective resistances R93–R95 and placing the system in the Fine detection mode. In Fine detect, the effective $R_{TEST}$ resistance is approximately 276 Ohms assuming continuity, as R93–R95 is switched out. An additional switch 154 is provided across the gain resistor R59 of amplifier 155 to switch in amplifier gain during fine detection, as will be explained.

Figure 6:
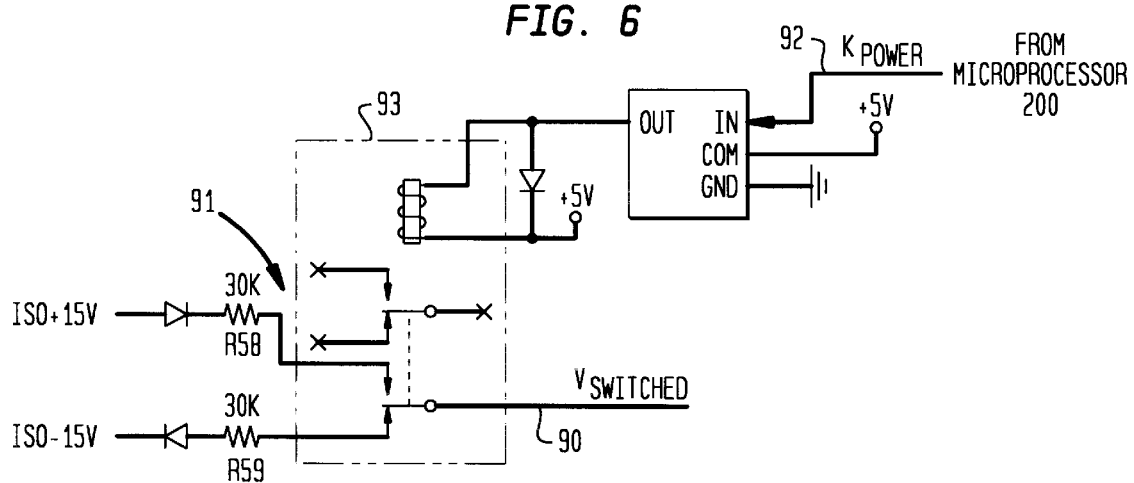
FIG. 6 is a detailed circuit diagram of switched voltage supply circuit 91.

In Fine Detection mode, a first sample phase is implemented whereby a positive current, i.e., I+, is injected into the test path by switched voltage source 90. Particularly, as shown in FIG. 6, switched voltage circuit 91 provides either positive or negative $V_{SWITCH}$ voltages in accordance with a logic control signal 92 output from the microprocessor control circuit 200. The $V_{SWITCH}$ voltage, e.g., +/−15 V, is sourced through resistor R58/R59 depending upon the logic control signal 92 and relay switching circuit 93, as shown in FIG. 6.

Referring back to FIG. 4, operational amplifier 155 and surrounding circuitry amplifies the resultant detected voltage signal to an operative voltage level, $V_{SHIN}$, which signal 156 is input to sample and hold circuit 175. As shown in FIG. 4, amplifier 155 is protected from over voltages by lightning/over voltage devices in the interface to the loop's Tip/Ring and from higher loop voltages, such as Ringing, by the voltage divider provided by R77 and R78 (See, FIG. 3). Additionally, the switch 154 is opened to provide the correct gain level in accordance with feedback resistor R59 and resistors R77 and R78. Specifically, the signal gain of amplifier 155, hereinafter, SIG_GAIN, is calculated in accordance with equation (2) as follows:

$$SIG\_GAIN = R59*(R78/(R77+R78)) \qquad (2)$$

Figure 7:
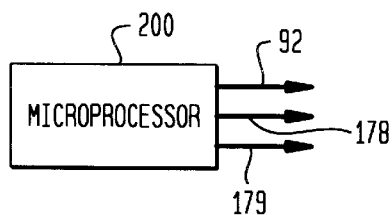
FIG. 7 shows microprocessor control of the switching elements.

As shown in FIG. 5, sample and hold circuit 175 comprises sample/hold amplifier 160 and additional circuitry to provide the sample and hold functionality which eliminates voltages alien to the detection circuitry 150. As the first switched current is injected, a digital control signal 178, output from microprocessor 200 (shown in FIG. 7) is set to activate a mechanical relay circuit 168 that generates a sample/hold control signal 169 enabling sample/hold amplifier 160 to perform a sample/hold function of the resultant $V_{SHIN}$ voltage at the input. This signal is then held at the output of amplifier 160 independent of any further input voltage changes. The amplified detected voltage signal 156, i.e., $V_{SHIN}$, that is held for the first sample phase is calculated according to equation 4 as follows:

$$V_{SHIN}(Sample) = SIG\_GAIN(V_{BAD}+(+15 \text{ V})(R_{TEST}/(R58+R_{TEST}))) \qquad (4)$$

with $V_{BAD}$ representing any extraneous voltage.

As long as logic control signal 178 from microprocessor 200 is active, the amplifier 160 will hold the signal $V_{SHIN}$ at the input 157 to a negative terminal of differential amplifier circuit 176 through a resistance R71. Immediately thereafter, in a second sample phase, the microprocessor 200 will reset logic control signal 92 to switch the voltage source 90 and inject the negative current, i.e., I−, into the test path. After application of the test current I−, the voltage $V_{SHIN}$ presented to the input of sample and hold circuit 175 is of a value as calculated according to equation (5):

$$V_{SHIN}(Hold) = SIG\_GAIN(V_{BAD}+(-15 \text{ V})(R_{TEST}/(R58+R_{TEST}))) \qquad (5)$$

As shown in FIG. 5, this second sample voltage, $V_{SHIN}$ (Hold), is then input as signal 158 to a positive terminal of differential amplifier circuit 176 through a resistance R72. Differential amplifier 176 generates a difference signal $V_{SHOUT}$, which is calculated according to equation (6) as follows:

$$V_{SHOUT} = (V_{SHIN}(Hold) - V_{SHIN}(Sample))/2 \qquad (6)$$

The divisor of two (2) is due to the sample and hold action of resistance R76 which is ½ the value of resistor R72 and connected between the positive terminal of differential amplifier circuit 176 and ground. Substituting equations (4) and (5) into equation (6) yields the following resultant voltage signal, $V_{SHOUT}$ $$V_{SHOUT} = SIG\_GAIN(-15(R_{TEST}/(R58+R_{TEST})))$$

For the circuit configuration of FIGS. 4 and 5, it is expected that the $V_{SHOut}$ voltage will be within +/−1.05 V levels during both course and fine detection. The VBAD voltage present at the input to the sample and hold circuit is completely eliminated by the opertion of differential amplifier 176, ensuring an accurate voltage representing continuity.

Referring back to FIG. 4, it is shown that the voltage $V_{SHOUT}$ output from differential amplifier 176 is input to the detector circuitry at comparator circuit 180 which outputs a continuity signal 185 indicating presence or absence of continuity. Specifically, the voltage divider circuits 181 and 182 of the comparator circuit 180 provide threshold inputs of a range of voltages of, e.g., +1.05 V and −1.05 V, respectively. Correct in-circuit wiring continuity exists when the voltage output signal $V_{SHOUT}$ of sample and hold circuit 175 voltage is within these comparator threshold limits. The output continuity detection signal 185 of comparator circuit 180 is input to opto-isolator circuit 190 for the purpose of isolating the detection circuitry from the digital circuitry and to provide a system indicator signal 198 for outward indication to a user.

Figures 8, 10:
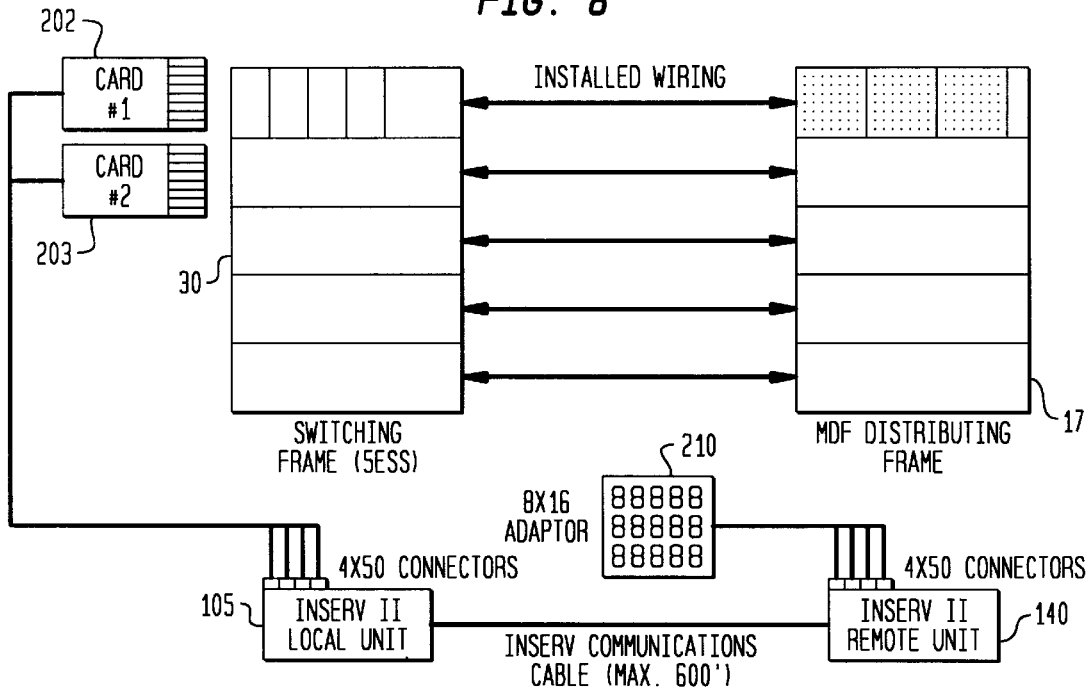

The in-circuit wiring verification system of the invention is provided with multi-testing capability for automatically testing many circuits, be it successively or in predefined testing patterns. Specifically, FIG. 8 illustrates the test setup connection for automated multi-lead testing, preferably, up to test 64 pairs (128 connections) per test. As shown in FIG. 8, the main unit 105 interfaces to the 5ESS switching frame 30 through, e.g., two extender cards 202, 203, with each card handling 32 Tip-Ring pairs. The remote unit 140 interfaces to the MDF through a fixture 210 which handles all 64 pairs. The remote and main units interface to each other through a 15-pin communication cable.

Figure 9:
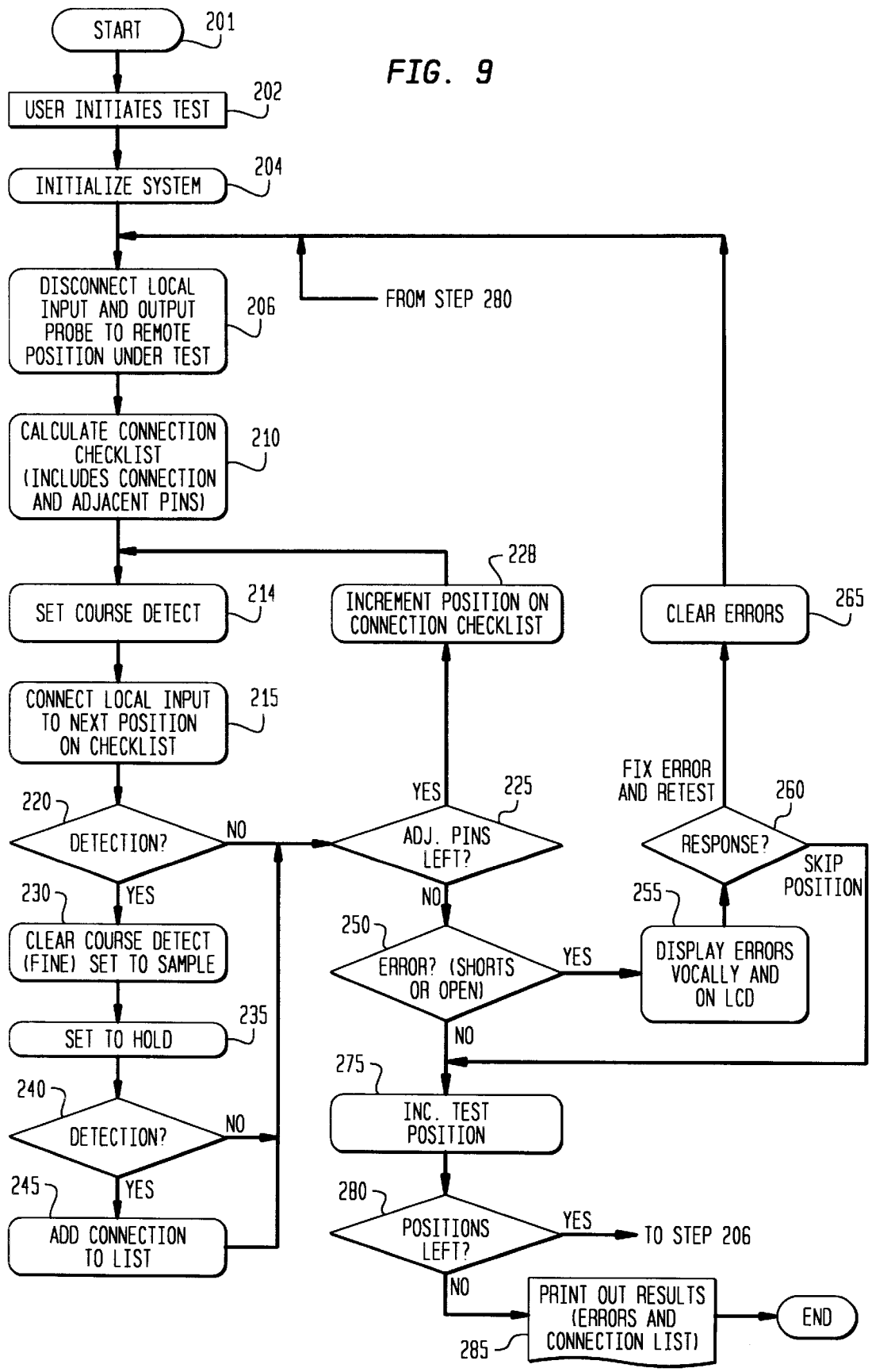
FIG. 9 shows a flow chart of the continuity testing methodology.

FIG. 9 illustrates the flow diagram for the multi-lead in-circuit wiring continuity detection method.

As illustrated in FIG. 9, at step 202, a user initiates a test using the system shown in FIGS. 2 and 9 by setting test parameters. The user may start the test remotely from the keypad or locally through push button means (not shown). At step, 204 the test system is initialized by reading the system parameters, such as test probe type, loading in scanning patterns for the in-circuit connections to be tested, and loading in the adjacent pin short detection algorithms and the location of the first testing position (position 1). Additionally, the connection and error lists are cleared. Next, at step 206, the local input is disconnected to break the loop and then the probe is output to the remote position which is the first position under test. At step 210, the test system creates a list of positions to check for continuity against the current position under test. This list includes the current testing position and the four forward scanning adjacent positions. An algorithm is implemented to calculate the adjacent positions as will be described.

Next at step 214, the course detct mode is implemented whereby the input is set to the high impedance as described herein. Then, at step 215, the test unit sets its logic to select the checklist position for input. A determination is then made at step 220 as to whether course detection is successful, i.e., the system has found that the wiring connection (line) is contiguous. If continuity is not detected, then at step 225, a determination is made as to whether any of the adjacent pins of the current test position are available for testing as calculated by the adjacent position algorithm. If there are adjacent pins left, then the system proceeds to step 228 to include the next adjacent pin's position on the check list and returns to step 214 to set the course detect phase for the new adjacent pin position.

If course detection was successful at step 220, then the system proceeds to initiate fine detect by first changing the input impedance levels, i.e., switching out high impedance resistors used to isolate the circuitry for course detect, to the levels associated with fine detection phase so that the input voltages can be accurately determined. Thus, the system is set to fine detect mode at step 230 by injecting the first positive test current into the circuit connection under test and sampling the $V_{SHIN}$(Sample) voltage as described above with reference to sample and hold circuit 175 (FIG. 5). Then, at step 235, the hold phase is initiated and the equal and opposite negative test current is injected into the circuit connection under test to obtain the $V_{SHIN}$(Hold) voltage. Then, in the manner described herein, a determination is made as to whether fme detection is successful at step 240. If the resultant voltage value meets the voltage criteria, continuity is detected. Otherwise, the wire is not contiguous.

If fine grain continuity is not detected, then the method proceeds to step 225, where the determination is made as to whether any adjacent pins are left. If there are adjacent pins left, then the system proceeds to step 228 to include its position on the check list and returns to step 214 to set the course detect phase for the net adjacent pin connection.

If at step 240, it is determined that detection is successful, then the connection found detected is added to the list of good connections for the position under test as shown at step 245.

Whether or not continuity is detected at steps 220 or 240, if there are no adjacent pins left, then the method proceeds to step 250 to determine the types of errors, e.g., shorts or opens. If there were errors, i.e., no continuity between the position under test and its corresponding local input or continuity found between the position under test and an adjacent position, then the error is visually and vocally communicated to the tester as indicated at step 255. At step 260, an opportunity for fixing the error is given and the connection may be retested. If the error is fixed, then the subject error that was found is cleared at step 265 and the system returns to step 206 to re-test that connection. If at step 250 there were no errors found in the current test connection or, the connection in which the error was determined is not to be rectified or retested, i.e., is skipped, then the process proceeds to step 275 to increment to the next test postion. Then, at step 280, a determination is made as to whether any further test positions remain on the checklist to be tested. If there are further test positions left to be tested, then the method continues to step 206 as shown in FIG. 9 to test the next position. If, at step 280, it is determined that there are no further test positions left to be tested, then at step 285, the results of connection errors and good connections are printed out or displayed.

The algorithm for calculating adjacent test positions for the current position under test is shown as pseudo-code in FIG. 11. Essentially, the algorithm will take into account the type of connecting block, e.g., base 8 connecting block, such as shown in FIG. 10, or any other connecting block such as base-16 type or AIU type connecting block, and the current probed test position. As shown in FIG. 10, for short testing, as the short testing is done in a forward fashion, the algorithm will calculate test positions only of subsequent adjacent positions. For example, for the current highlighted test position 56, adjacent test positions 41, 57, 72 and 73 will be checked for shorts as it is assumed that they have been previously tested. This for with the illustration.

The foregoing merely illustrates the principles of the present invention. Those skilled in the art will be able to devise various modifications, which although not explicitly described or shown herein, embody the principles of the invention and are thus within its spirit and scope.

What is claimed is:

1. An in-circuit, wiring verification system for testing circuit wiring installed in an operational electrical circuit that is in use and having a first voltage source, said system comprising:
   a) means for providing an isolated reference potential to a first location in said operational circuit;
   b) a second voltage source for successively injecting first and second equal and opposite polarity currents into said operational circuit at a second location, said second voltage source providing voltage with reference to said isolated reference potential;
   c) means for obtaining a first voltage produced by said first injected current and further obtaining a second voltage produced by said second equal and opposite polarity injected current;
   d) means for generating a difference signal representing difference between said first voltage and said second voltage;
   e) means for comparing said difference signal to predetermined threshold values and generating an output signal indicating continuity between said installed wiring and said operational circuit when said difference signal is between said predetermined threshold values.

2. An in-circuit, wiring verification system as claimed in claim 1, further including means for normalizing said first and second voltages at said second location at each time said second voltage source is applied.

3. An in-circuit, wiring verification system as claimed in claim 2, wherein said normalizing means includes means for adjusting impedance of said in-circuit, wiring verification system to enable equalization of voltage at said second location produced by said first voltage source in said operational circuit and said second voltage produced by said second voltage source.

4. An in-circuit, wiring verification system as claimed in claim 3, wherein said impedance adjusting means includes a switch device for switching in a high impedance element in series with said second voltage source to increase said impedance and switching out said high impedance element to decrease said impedance after equalization of voltages at said second location.

5. An in-circuit, wiring verification system as claimed in claim 3, further including control means for controlling application of said second voltage source and said switch device; an amplifier that converts said first voltage into a third voltage and said second voltage into a fourth voltage; and sampling means for providing said third voltage and said fourth voltage to said means for generating a difference signal.

6. An in-circuit, wiring verification system as claimed in claim 5, wherein said sampling means includes a sample and hold circuit for sampling said third voltage and holding said sampled third voltage at an output thereof as said equal and opposite polarity second current is injected into said operational circuit.

7. An in-circuit, wiring verification system as claimed in claim 6, wherein said means for generating a difference signal includes a difference amplifier for receiving said held sampled third voltage at a first input thereof and for receiving said fourth voltage at a second input thereof.

8. An in-circuit, wiring verification system as claimed in claim 6, wherein said control means generates a control signal to enable said sampling means to hold said sampled third voltage as said equal and opposite polarity second current is injected into said operational circuit.

9. An in-circuit, wiring verification system as claimed in claim 1, wherein said first and second voltages each include a voltage signal present in normal course of operation.

10. An in-circuit, wiring verification system as claimed in claim 9, wherein said operational circuit is a telephone switching circuit, said voltage signal present in normal course of operation includes a voltage signal present due to an off-hook condition, said means for generating a difference signal further eliminates influence of said voltage signal.

11. An in-circuit, wiring verification system as claimed in claim 1, further including means responsive to said output signal for providing outward indication that continuity exists between said operational circuit and said installed wiring.

12. An in-circuit, wiring verification system as claimed in claim 11, wherein said means responsive to said output signal includes opto-isolation circuitry for isolating said outward indication from said comparing means.

13. A process for verifying continuity of wiring installed in a currently operational circuit comprising the steps of:
   a) providing an isolated reference potential to a first location in said currently operational circuit;
   b) injecting a first current into said operational circuit at a second location utilizing a voltage source;
   c) sampling a first voltage produced by said first injected current of said circuit and holding said first voltage;
   d) injecting a second current into said operational circuit at said second location, said second current being equal in magnitude and opposite in polarity to said first current;
   e) sampling a second voltage produced by said second current;
   f) generating a signal representing a difference between said sampled and held first voltage and said second voltage;
   g) comparing said difference signal with predetermined threshold values, said difference signal indicating presence of continuity in said installed wiring when said difference signal is between said predetermined threshold values.

14. A process for verifying continuity as claimed in claim 13, further including the step of normalizing said first voltage at said second location at a time said first current is injected.

15. A process for verifying continuity as claimed in claim 14, wherein said normalizing step includes the step of adjusting impedance of a device used for verifying continuity to enable equalization of voltage at said second location produced by a first voltage source in said operational circuit and a voltage introduced to said operational circuit by injecting said first current.

16. A process for verifying continuity as claimed in claim 15, wherein said impedance adjusting step includes switching in a high impedance element in series with said voltage source to increase said device impedance and switching out said high impedance element to decrease said device impedance after equalization of voltages at said second location.

* * * * *